US012707570B2

(12) United States Patent
Fischer et al.

(10) Patent No.: US 12,707,570 B2
(45) Date of Patent: Aug. 11, 2026

(54) ELECTRONIC ASSEMBLY HAVING A POWER SEMICONDUCTOR COMPONENT BETWEEN TWO CIRCUIT CARRIERS, AND METHOD FOR PRODUCING SAME

(71) Applicant: Robert Bosch GmbH, Stuttgart (DE)

(72) Inventors: Arne Stephen Fischer, Leinfelden-Echterdingen (DE); Hartmut Wayand, Pfullingen (DE); Johannes Meckbach, Tuebingen (DE); Lukas Loeber, Ludwigsburg (DE); Thomas Kiedrowski, Sersheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 239 days.

(21) Appl. No.: 18/685,137

(22) PCT Filed: Jul. 29, 2022

(86) PCT No.: PCT/EP2022/071346
§ 371 (c)(1),
(2) Date: Feb. 20, 2024

(87) PCT Pub. No.: WO2023/030788
PCT Pub. Date: Mar. 9, 2023

(65) Prior Publication Data

US 2024/0349429 A1 Oct. 17, 2024

(30) Foreign Application Priority Data

Aug. 30, 2021 (DE) ..................... 10 2021 209 486.4

(51) Int. Cl.
*H05K 1/181* (2026.01)
*H05K 3/34* (2006.01)
(Continued)

(52) U.S. Cl.
CPC ............... *H05K 1/181* (2013.01); *H05K 3/34* (2013.01); *H10W 90/401* (2026.01);
(Continued)

(58) Field of Classification Search
CPC .... H05K 1/14; H05K 1/144–147; H05K 1/18; H05K 1/181–187; H01L 23/498;
(Continued)

(56) References Cited

U.S. PATENT DOCUMENTS 5,218,231 A * 6/1993 Kudo ...................... H01L 24/41 257/723
7,295,448 B2 * 11/2007 Zhu .................. H02M 3/33576 363/17

(Continued)

FOREIGN PATENT DOCUMENTS

DE 102015205704 A1 10/2016
EP 1329951 A2 7/2003

(Continued)

OTHER PUBLICATIONS

International Search Report for PCT/EP2022/071346, Issued Nov. 11, 2022.

*Primary Examiner* — Tuan T Dinh
(74) *Attorney, Agent, or Firm* — NORTON ROSE FULBRIGHT US LLP

(57) ABSTRACT

An electronic assembly having a power semiconductor component and a circuit carrier. The power semiconductor component has a contact region on opposite sides; the contact region facing the circuit carrier is in electrical contact with a connection region of the circuit carrier; the power semiconductor component is in electrical contact on the side facing away from the circuit carrier, in the region of the contact region, with a further circuit carrier; an additively generated connecting layer is arranged on the contact (Continued)

region and/or the connection region of the circuit carriers; and the connecting layer is connected to the connection region and/or the contact region using a solder connection. The connecting layer has a lower modulus of elasticity in a direction or plane extending perpendicularly to the surface of the power semiconductor component than in a direction or plane extending in parallel with the surface of the power semiconductor component.

12 Claims, 1 Drawing Sheet

(51) Int. Cl.
*H10W 90/00* (2026.01)
*H10W 72/00* (2026.01)

(52) U.S. Cl.
CPC ............. *H05K 2201/10166* (2013.01); *H10W 72/07336* (2026.01); *H10W 90/734* (2026.01)

(58) Field of Classification Search
CPC ......... H01L 23/49811; H01L 23/49833; H01L 23/552
USPC ........ 361/700–710, 767–774, 790, 792–795; 257/660–690
See application file for complete search history.

(56) References Cited

U.S. PATENT DOCUMENTS

| | | | | |
|---|---|---|---|---|
| 8,953,335 | B2 * | 2/2015 | Abe | H10W 40/10 361/728 |
| 11,309,273 | B2 * | 4/2022 | Ikeda | H01L 23/49517 |
| 11,342,241 | B2 * | 5/2022 | Cheng | H10W 40/00 |
| 2011/0057713 | A1 * | 3/2011 | Kawanami | H01L 25/16 361/728 |
| 2013/0015495 | A1 * | 1/2013 | Hauenstein | H05K 7/209 257/140 |
| 2013/0020694 | A1 * | 1/2013 | Liang | H01L 23/3735 257/691 |
| 2016/0181217 | A1 | 6/2016 | Prack | |
| 2016/0315059 | A1 | 10/2016 | Crema et al. | |
| 2016/0351468 | A1 * | 12/2016 | Liang | H01L 23/3735 |
| 2019/0371703 | A1 | 12/2019 | Matsuzaki et al. | |
| 2021/0151417 | A1 * | 5/2021 | Strogies | H01L 23/49838 |

FOREIGN PATENT DOCUMENTS

| | | | | |
|---|---|---|---|---|
| EP | 2871675 | A1 | 5/2015 | |
| EP | 2945189 | A1 | 11/2015 | |
| EP | 3739624 | A1 | 11/2020 | |
| JP | 2017084850 | A | 5/2017 | |
| JP | 2019532492 | A | 11/2019 | |
| WO | WO-2018055148 | A1 * | 3/2018 | H01L 23/473 |

* cited by examiner

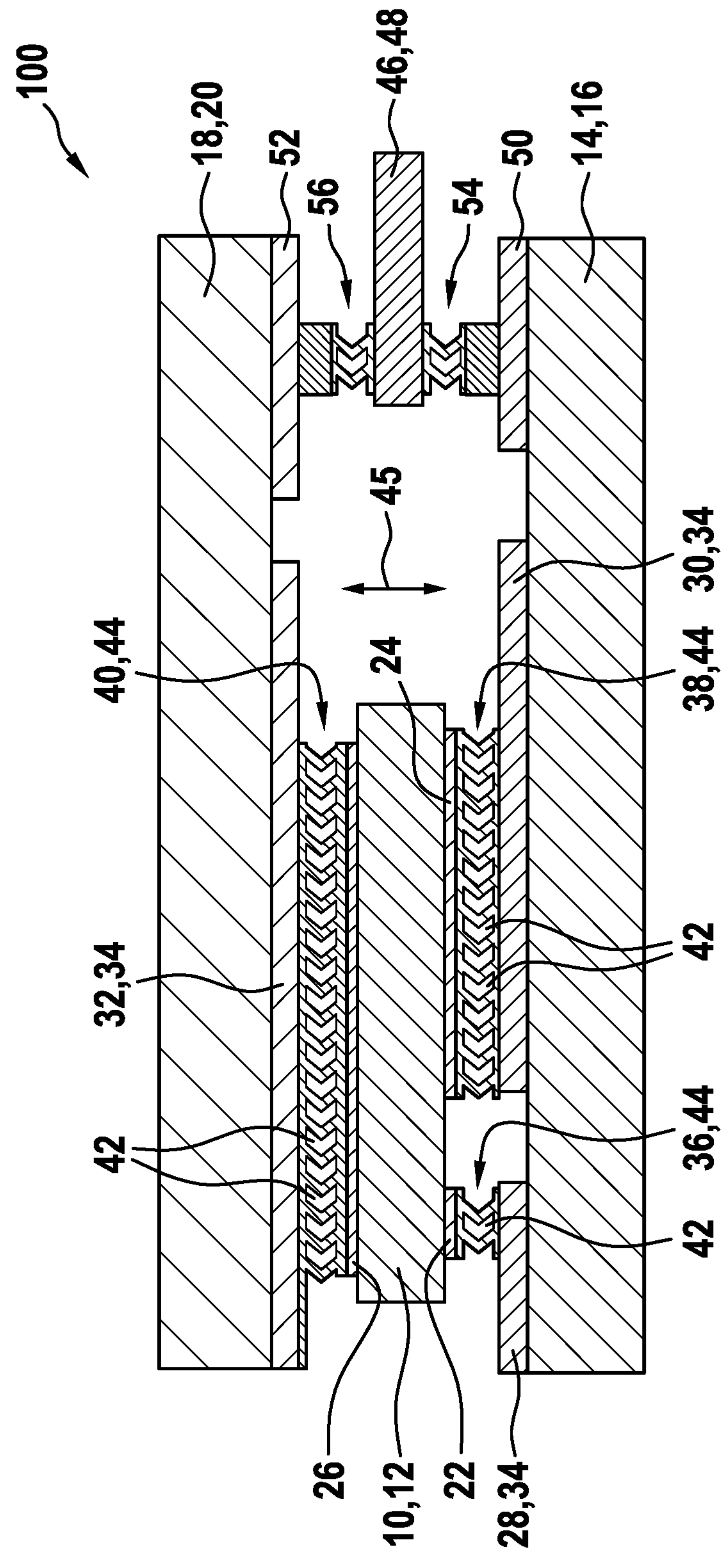
100
18,20
52
56
46,48
54
50
14,16
45
30,34
40,44
24
38,44
42
32,34
42
36,44
42
26
10,12
22
28,34

ELECTRONIC ASSEMBLY HAVING A POWER SEMICONDUCTOR COMPONENT BETWEEN TWO CIRCUIT CARRIERS, AND METHOD FOR PRODUCING SAME

FIELD

The present invention relates to an electronic assembly between a power semiconductor component and two circuit carriers, which is characterized in particular by good thermomechanical properties and advantageous production. The present invention also relates to a method for forming an electronic assembly according to the present invention.

BACKGROUND INFORMATION

German Patent Application No. DE 10 2015 205 704 A1 describes an electronic assembly. The conventional electronic assembly has a circuit carrier in the form of a DBC (direct bonded copper), which is connected via a solder connection to an underside of a power semiconductor component designed as a transistor. The electrical contacting of the upper side of the power semiconductor component with the circuit carrier takes place via bond wire connections.

SUMMARY

The electronic assembly according to the present invention between a power semiconductor component and a circuit carrier, comprising the power semiconductor component and the circuit carrier, may have an advantage that it allows a particularly compact arrangement of a power semiconductor component arranged between two circuit carriers, and at the same time, good thermomechanical properties.

The aforementioned advantages may be achieved in an electronic assembly according to the present invention in that the power semiconductor component is in electrical contact on the side facing away from the circuit carrier, in the region of at least one contact region, with a further circuit carrier, in that an additively generated connecting layer is arranged on at least one contact region and/or a connection region, and in that the connecting layer is connected to the connection region and/or to the contact region by means of a solder connection.

Advantageous developments of the electronic assembly according to the present invention are disclosed herein.

In order to reduce in particular thermomechanical loads on the power semiconductor component or the circuit carrier in a direction perpendicular to the plane of the power semiconductor component or the circuit carrier, it is particularly preferably provided that the connecting layer has a lower modulus of elasticity in a direction extending perpendicularly to the surface of the power semiconductor component than in a direction extending in parallel with the surface of the power semiconductor component. In other words, this means that different, direction-dependent elasticities of the connecting layer are generated.

According to an example embodiment of the present invention, it is furthermore preferably provided that the connecting layer is formed from a plurality of sub-layers of a metal starting material, and that at least some of the sub-layers have gaps or free spaces in a direction extending in parallel with the surface of the power semiconductor component. The gaps or free spaces serve in particular to achieve different moduli of elasticity in the mentioned two directions that run perpendicularly to the surface of the power semiconductor component, as well as optionally improved cooling or improved heat dissipation. The connecting layer is produced in practice in particular in that sub-layers of the connecting layer are produced gradually by applying a metal powder, which sub-layers, after application, are selectively melted by a laser beam (or a photon beam). The melted material subsequently solidifies to form a portion of the connecting layer, while the non-melted material is removed from the region of the connecting layer in a downstream processing cycle. The metal powder preferably consists of or contains copper and/or aluminum and/or a copper alloy and/or an aluminum alloy. Alternatively or additionally, the metal powder contains a composite comprising carbon. In a particularly advantageous manner, the additive construction allows mixing of the materials mentioned to form a powder mixture, in order to generate different alloys by means of the melting process. Moreover, it is explained that in addition to the mentioned additive manufacturing process, other conventional additive manufacturing processes from the related art can of course also be used in order to produce the connecting layer.

In a preferred development of the present invention, it is provided that the connecting layer has a lower modulus of elasticity in a plane extending perpendicularly to the surface of the power semiconductor component than in a plane extending in parallel with the plane of the power semiconductor component, in particular by forming the connecting layer with a herringbone pattern. Such a herringbone pattern makes the mentioned different direction-dependent elasticities of the connecting layer possible. However, other geometries of the connecting layer to realize the different (direction-dependent) elasticities are also possible.

For optimized connection of the connecting layer, it can be provided that at least a first sub-layer of the connecting layer formed on the contact region or the contact region is designed as a full-surface sub-layer.

In another preferred embodiment of the present invention, for improving the solder connection, at least one other sub-layer of the connecting layer, which is on the side facing the connection region, has gaps or free spaces.

In a further embodiment of the present invention, the circuit carrier and the further circuit carrier are in electrical contact with one another in the region outside the power semiconductor component, optionally with the interposition of a contact element, and at least one additively generated connecting layer is arranged in the region of the contacting.

The electronic assembly described thus far provides in particular that the power semiconductor component is a transistor, and the circuit carrier and the further circuit carrier are each a substrate.

Furthermore, the present invention also includes a method for forming an electronic assembly, in particular an electronic assembly according to the present invention described thus far. The method according to an example embodiment of the present invention comprising at least the following steps: firstly, a connecting layer is constructed on and/or in the region of a contact region of the power semiconductor component and/or on a connection region of the circuit carrier and/or of the further circuit carrier in an additive manufacturing process. Subsequently, the circuit carrier and the further circuit carrier are brought into contact with the interposition of the power semiconductor component. Finally, a solder connection is formed between the connecting layer and the connection region or the contact region.

In a preferred development of the method of the present invention, a solder is applied to the connecting layer by dispensing.

Further advantages, features, and details of the present invention can be found in the following description of preferred embodiments of the present invention and with reference to the drawing.

BRIEF DESCRIPTION OF THE DRAWING

FIG. 1 shows, in a simplified longitudinal section, an electronic assembly between a power semiconductor component designed as a transistor and circuit carriers, each in the form of a substrate, arranged on opposite sides of the power semiconductor component, according to an example embodiment of the present invention.

DETAILED DESCRIPTION OF EXAMPLE EMBODIMENTS

An electronic assembly 100 is shown in FIG. 1, which assembly comprises a power semiconductor component 10 in the form of a transistor 12, a circuit carrier 14 in the form of a substrate 16 and a further circuit carrier 18, also in the form of a substrate 20, the power semiconductor component 10 being in electrical contact with the two circuit carriers 14 and 18. Furthermore, the planes of the power semiconductor component 10 and of the two circuit carriers 14 and 18 extend in parallel with one another.

On the side facing the circuit carrier 14, the power semiconductor component 10 has two contact regions 22, 24 arranged separately from one another and formed by metallizations, and on the side facing the further circuit carrier 18, a single contact region 26 likewise formed by a metallization. Furthermore, connection regions 28, 30, 32 in the form of conductor trace sections 34 are provided on the two circuit carriers 14 and 18, associated with the relevant contact region 22, 24 and 26.

Additively produced connecting layers 36, 38 and 40 are arranged between the connection regions 28, 30 and 32 and the contact regions 22, 24 and 26. The connecting layers 36, 38 and 40, which are preferably produced by layer-by-layer construction of a metal starting material (metal powder) and subsequent selective melting of the starting material by means of an electron beam (laser beam), are generated, in particular, on the connection regions 28, 30 or 32, alternatively or additionally on the contact regions 22, 24 and 26 of the power semiconductor component 10.

Furthermore, the connection between the connecting layers 36, 38 and 40 and the circuit carriers 14 and 18 and the power semiconductor component 10 takes place via solder connections (not shown in FIG. 1). The solder connections are always formed on the side or the element on which no construction of the connecting layer 36, 38, 40 takes place.

As can be seen from FIG. 1, gaps 42 or free spaces are formed in the connecting layers 36, 38 and 40 in a plane extending perpendicularly to the plane of the power semiconductor component 10 and the circuit carriers 14 and 18 or in parallel with the drawing plane of FIG. 1. In particular, the connecting layers 36, 38 and 40 each form herringbone patterns 44, in such a way that, according to the double arrow 45 in a direction perpendicular to the plane of the power semiconductor component 10 and the circuit carriers 14 and 18, the connecting layers 36, 38 and 40 have a lower rigidity or a lower modulus of elasticity than in the direction of the plane of the power semiconductor component 10 or of the circuit carriers 14 and 18. As a result, thermomechanical stresses extending in the direction of the double arrow 45 are at least partially absorbed or equalized by the connecting layer 36, 38, 40 in the sense of a spring element, and a forwarding of corresponding stresses to the power semiconductor component 10 or the circuit carriers 14, 18 is reduced.

In addition, it can be provided that the two circuit carriers 14 and 18 are in electrical contact with one another in a region outside the power semiconductor component 10. In the embodiment shown, a contact element 46 in the form of a solder connector 48 is additionally provided between the two circuit carriers 14 and 18. Connecting layers 54 and 56 formed in an additive manufacturing process, which are arranged between the conductor trace sections 48 and 50 and the contact element 46, are also formed between the contact element 46 and conductor trace sections 50, 52 of the two circuit carriers 14 and 18.

The electronic assembly 100 described thus far can be modified in many ways without deviating from the idea of the present invention.

The invention claimed is:

1. An electronic assembly, comprising:

a power semiconductor component and a circuit carrier, the power semiconductor component having at least one contact region on each of opposite sides of the power semiconductor component, and at least of the contact regions facing the circuit carrier being in electrical contact with a connection region of the circuit carrier;

wherein the power semiconductor component is in electrical contact on a side facing away from the circuit carrier, in a region of at least one of the contact regions of the power semiconductor component, with a further circuit carrier, an additively generated connecting layer is arranged on the at least one contact region and/or the connection region of the circuit carriers, and the at least one connecting layer is connected to the connection region and/or the contact region by a solder connection;

wherein the connecting layer has a lower modulus of elasticity in a direction extending perpendicularly to a surface of the power semiconductor component than in a direction extending in parallel with the surface of the power semiconductor component.

2. The electronic assembly according to claim 1, wherein the connecting layer is formed from a plurality of sub-layers of a metal starting material, and at least some of the sub-layers have gaps or free spaces in a plane extending in parallel with a surface of the power semiconductor component.

3. The electronic assembly according to claim 1, wherein the connecting layer has a lower modulus of elasticity in a plane extending perpendicularly to a surface of the power semiconductor component than in a plane extending in parallel with a plane of the power semiconductor component, by forming the connecting layer with a herringbone pattern.

4. The electronic assembly according to claim 1, wherein the circuit carrier and the further circuit carrier are in electrical contact with one another in a region outside the power semiconductor component, and at least one of the additively generated connecting layers is arranged in a region of the contacting.

5. The electronic assembly according to claim 1, wherein the circuit carrier and the further circuit carrier are in electrical contact with one another in a region outside the power semiconductor component, with an interposition of a contact element, and at least one of the additively generated connecting layers is arranged in a region of the contacting.

6. The electronic assembly according to claim 1, wherein the power semiconductor component is a transistor and the circuit carrier and the further circuit carrier are each a substrate.

7. The electronic assembly according to claim 1, wherein the connecting layer is produced by layer-by-layer construction of a metal starting material and subsequent selective melting of the metal starting material by an electron beam.

8. The electronic assembly according to claim 2, wherein at least a first sub-layer of the connecting layer formed on the contact region or the connection region is a full-surface sub-layer.

9. The electronic assembly according to claim 2, wherein at least one of the sub-layers of the connecting layer arranged on the side facing the connection region has gaps or free spaces.

10. The electronic assembly according to claim 7, wherein the metal starting material is metal powder and the electron beam is a laser beam.

11. A method for forming an electronic assembly, the method comprising the following steps:

constructing a connecting layer on and/or in a region of a contact region of a power semiconductor component and/or on a connection region of a circuit carrier and/or of a further circuit carrier in an additive manufacturing process;

contacting the circuit carrier and the further circuit carrier with interposition of the power semiconductor component; and forming a solder connection between the connecting layer and: (i) the connection region, or (ii) the contact region;

wherein the connecting layer has a lower modulus of elasticity in a direction extending perpendicularly to a surface of the power semiconductor component than in a direction extending in parallel with the surface of the power semiconductor component.

12. The method according to claim 11, wherein a solder is applied on the connecting layer by dispensing.

* * * * *